(12) United States Patent
Plessier et al.

(10) Patent No.: US 6,542,413 B1
(45) Date of Patent: Apr. 1, 2003

(54) MULTIPLE ACCESS STORAGE DEVICE

(75) Inventors: Bernard Plessier, Aix en Provence (FR); Alain Pomet, Rousset (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/491,428

(22) Filed: Jan. 26, 2000

(30) Foreign Application Priority Data

Jan. 27, 1999 (FR) ............................................. 99 00988

(51) Int. Cl.$^7$ ................................................. G11C 7/00
(52) U.S. Cl. ............................. 365/189.05; 365/189.12
(58) Field of Search ....................... 365/189.05, 189.12, 365/220, 221

(56) References Cited

U.S. PATENT DOCUMENTS

| | | | |
|---|---|---|---|
| 4,858,190 A | * 8/1989 | Yamaguchi et al. ... | 365/189.05 |
| 5,321,399 A | 6/1994 | Notani et al. | |
| 5,568,431 A | * 10/1996 | Mohan .................. | 365/189.12 |
| 5,854,767 A | 12/1998 | Nishi et al. | |

OTHER PUBLICATIONS

Mayu Miyauchi, "100–MHZ Serial Access Architecture for 4–MB Field Memory" IEEE Journal of Solid–State Circuits, vol. 26, No. 4, Apr. 1, 1991, pp. 555–559, XP000216727.

Preliminary Search Report dated Oct. 13, 1999 with annex on French Application No. 99/00988.

\* cited by examiner

*Primary Examiner*—Huan Hoang
(74) *Attorney, Agent, or Firm*—Lisa K. Jorgenson; Stephen Bongini; Fleit, Kain, Gibbons, Gutman & Bongini P.L.

(57) ABSTRACT

A storage device is provided. The storage device includes at least one memory having a parallel data bus and a parallel address bus; a first k-bit latch circuit having a parallel input and a parallel output, with the parallel input being connected to the data bus; a first k-bit shift register having a parallel input and a series output, with the parallel input being connected to the output of the first latch circuit; a second k-bit latch circuit having a parallel input and a parallel output, with the parallel output being connected to the data bus; and a second k-bit shift register having a series input and a parallel output, with the parallel output being connected to the input of the second latch circuit. In a preferred embodiment, a control circuit is coupled to the address bus, with the control circuit including address registers for storing as many address pointers as the number of k-bit shift registers. Also provided is a coprocessor of the type that includes a series input terminal, a series output terminal, and computation elements located on at least one data path between the series input terminal and the series output terminal. Further, an IC chip card that includes a microprocessor, storage, and a coprocessor is provided.

24 Claims, 5 Drawing Sheets

MULTIPLE ACCESS STORAGE DEVICE

CROSS-REFERENCE TO RELATED APPLICATIONS

This application is based upon and claims priority from prior French Patent Application No. 99-00988, filed Jan. 27, 1999, the entire disclosure of which is herein incorporated by reference.

BACKGROUND OF THE INVENTION

1. Field of the Invention

The present invention relates to multiple access storage devices, and more specifically to a parallel memory device that can be used to replace a plurality of large shift registers.

2. Description of Related Art

A serial-type architecture is typically used to make computation devices for numbers encoded with a large number of bits. The main advantage of serial-type architectures is that they considerably reduce the number of computation elements (e.g., adder, subtracter, multiplier, and the like). However, some elements used in serial architectures have a size that is slightly greater than in parallel architectures. These are the storage elements, and namely shift registers.

This drawback can be identified more clearly in an exemplary modular arithmetic coprocessor with a series architecture, such as those disclosed in EP-A-0 601 907, EP-A-0 712 070, EP-A-0 712 071, EP-A-0 712 072, EP-A-0 778 518, EP-A-0 784 262, EP-A-0 785 502, EP-A-0 785 503, EP-A-0 793 165, EP-A-0 853 275, WO/97 25668, and European Patent Application No. 98-470020.3 (filed Aug. 26, 1998). As shown in these references, three or four large registers (depending on the application) having a size of 256, 512, 1024, or more bits are used. Furthermore, the large registers may be arranged differently in order to give a variable size that provides flexibility, and to reduce the consumption of the registers.

FIG. 1, which corresponds to FIG. 1 of European Patent Application No. 98-470020.3, shows a modular arithmetic coprocessor. The coprocessor 1 includes four m×Bt bit shift registers 2 to 5, where m and Bt are conventionally equal to a power of two (for example, 8 or 16 for m and 32 or 64 for Bt); four multiplexers 6 to 9 that are associated with each of the four registers 2 to 5, respectively; computation circuitry 10, 11, 19, 20, 26, 29, and 35 of the series adder, series subtracter, and series multiplier type; storage 17, 18, 22, 23, and 25 of the series/parallel register type and transparent latch circuit type for storing Bt bit words; delays 28, 32 and 33 for introducing delays of Bt clock cycles; and multiplexers 12 to 16, 21, 24, 27, 30, 31, 34, 37, and 38 for transmitting data between the other elements of the coprocessor 1. The coprocessor 1 can perform different modular and non-modular operations by shifting the data in one or more of the four registers 2 to 5. Further information on the operation of the coprocessor 1 is available in the references mentioned above, which are herein incorporated by reference.

A coprocessor 1 of this kind can be used in a chip card along with a memory and a standard microprocessor, which controls the coprocessor. The coprocessor 1 is typically used to perform computations for encryption. Because the size of the keys used in encryption is constantly increasingly, these keys require the use of increasingly bigger (at present 512-bit or 1024-bit) registers 2 to 5. The size of these registers amounts to about 40% of the surface area of the coprocessor 1. Furthermore, the use of shift registers requires serial loading of the data. This is particularly detrimental to the performance of the circuit during data exchanges between the memory and the coprocessor 1. Additionally, the use of the registers leads to a loss of time when exchanging the contents of two registers.

SUMMARY OF THE INVENTION

In view of these drawbacks, it is an object of the present invention to overcome the above-mentioned drawbacks and to provide a smaller storage device having greater flexibility for data transfers. The present invention is not restricted to use with a modular arithmetic coprocessor, but can be applied to any computation device that uses serial type data routing and at least one relatively large register.

One embodiment of the present invention provides a storage device that includes at least one memory having a parallel data bus and a parallel address bus; a first k-bit latch circuit having a parallel input and a parallel output, with the parallel input being connected to the data bus; a first k-bit shift register having a parallel input and a series output, with the parallel input being connected to the output of the first latch circuit; a second k-bit latch circuit having a parallel input and a parallel output, with the parallel output being connected to the data bus; and a second k-bit shift register having a series input and a parallel output, with the parallel output being connected to the input of the second latch circuit. In a preferred embodiment, a control circuit is coupled to the address bus, with the control circuit including address registers for storing as many address pointers as the number of k-bit shift registers.

Another embodiment of the present invention provides a coprocessor of the type that includes a series input terminal, a series output terminal, and computation elements located on at least one data path between the series input terminal and the series output terminal. The coprocessor includes at least one memory having a parallel data bus and a parallel address bus; a first k-bit latch circuit having a parallel input and a parallel output, with the parallel input being connected to the data bus; a first k-bit shift register having a parallel input and a series output, with the parallel input being connected to the output of the first latch circuit; a second k-bit latch circuit having a parallel input and a parallel output, with the parallel output being connected to the data bus; and a second k-bit shift register having a series input and a parallel output, with the parallel output being connected to the input of the second latch circuit. The series input terminal is coupled to the output of the first shift register, and the output terminal is coupled to the input of the second shift register. In one preferred embodiment, the memory consists of two independent memories that each have k'-bit data access (where k=2×k'), and one of the independent memories is coupled to the least significant lines of the data bus and the other independent memory is coupled to the most significant lines of the data bus.

Yet another object of the present invention provides an IC chip card that includes a microprocessor, storage, and a coprocessor. The coprocessor includes a series input terminal; a series output terminal; computation elements located on at least one data path between the series input terminal and the series output terminal; at least one memory having a parallel data bus and a parallel address bus; a first k-bit latch circuit having a parallel input and a parallel output, with the parallel input being connected to the data bus; a first k-bit shift register having a parallel input and a series output, with the parallel input being connected to the output of the first latch circuit; a second k-bit latch circuit having a parallel input and a parallel output, with the parallel output being connected to the data bus; and a second k-bit shift register having a series input and a parallel output, with the parallel output being connected to the input of the second latch circuit. The series input terminal is coupled to the output of the first shift register, and the output terminal is coupled to the input of the second shift register. In a preferred embodiment, the coprocessor also includes a third k-bit latch circuit having a parallel input and a parallel output, with the parallel input being connected to the data bus; a third k-bit shift register having a parallel input and a series output, with the parallel input being connected to the output of the third latch circuit; a fourth k-bit latch circuit having a parallel input and a parallel output, with the parallel input being connected to the data bus; and a fourth k-bit shift register having a parallel input and a series output, with the parallel input being connected to the output of the fourth latch circuit.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1:
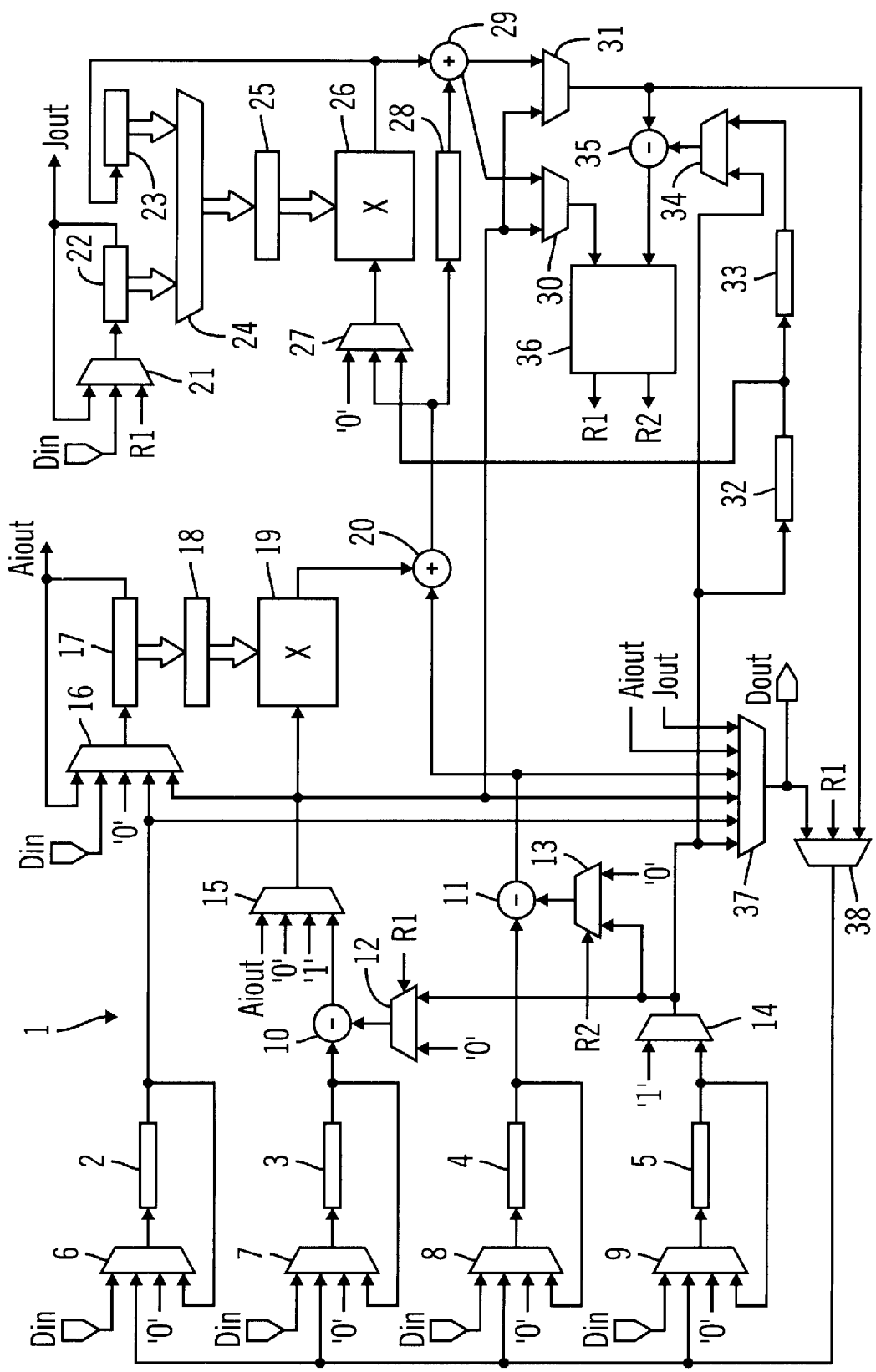
FIG. 1 shows a conventional coprocessor that operates through serial data shifts on a given path.
Figure 2:
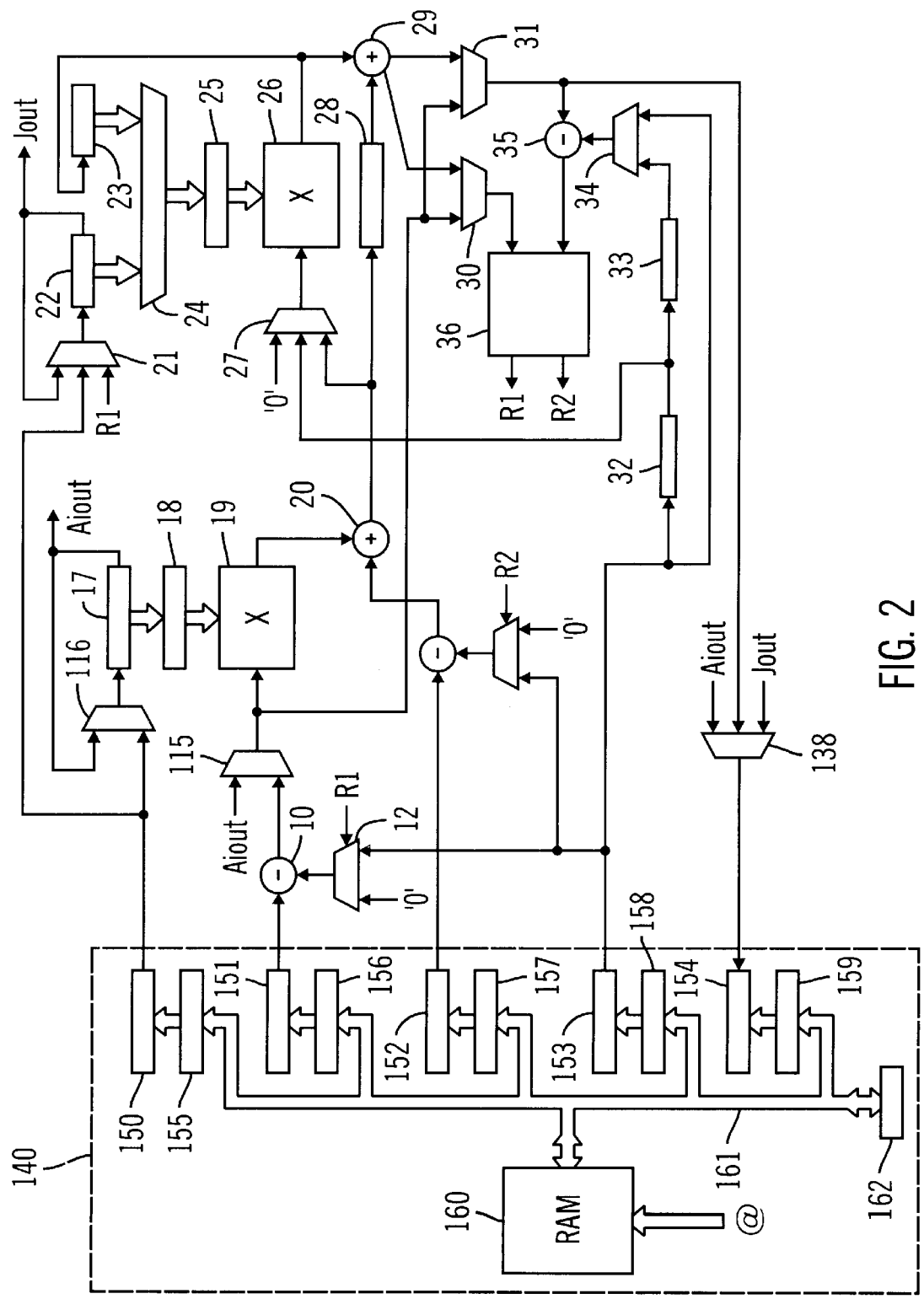
FIG. 2 shows a coprocessor according to a preferred embodiment of the present invention.

FIG. 2 shows a coprocessor according to a preferred embodiment of the present invention. The coprocessor of FIG. 2 fulfills the same functions as the coprocessor of FIG. 1, and elements of FIG. 2 that are identical to the elements of FIG. 1 bear the same reference numerals. The coprocessor of FIG. 2 differs essentially in the elimination of the four shift registers 2 to 5 and the four multiplexers 6 to 9. These elements are replaced by a storage device 140 that includes first to fourth k-bit shift registers 150 to 153, with each having a k-bit parallel input and a series output; a fifth k-bit register 154 having a series input and a k-bit parallel output; first to fifth transparent latch circuits 155 to 159, with each having a parallel input and a parallel output; and a memory 160 (for example, of the RAM type) having a k-bit parallel input/output and a parallel address input with a size sufficient to address the words of the memory.

The outputs of the first to fourth latch circuits 155 to 158 are respectively connected to the inputs of the first to fourth registers, and the input of the fifth latch circuit 159 is connected to the output of the fifth register 154. Additionally, a k-bit data bus 161 is connected to the data input/output of the memory 160, the inputs of the first to fourth latch circuits 155 to 158, and the output of the fifth latch circuit 159. A data input/output port 162 is also connected to the data bus 161. The storage device 140 may be controlled by an external processor or a state machine.

In the preferred embodiment, the operation of the storage device 140 is cyclical and includes the following steps. First, a data element is read from a first address of the memory 160 and stored in the first latch circuit 155. The first address is incremented, and another data element is read from a second address of the memory 160. This data element is stored in the second latch circuit 156 and then the second address is incremented. Next, a data element is read from a third address of the memory 160 and stored in the third latch circuit 157. The third address is incremented, and another data element is read from a fourth address of the memory 160. This data element is stored in the fourth latch circuit 158 and then the fourth address is incremented.

The contents of the first to fourth latch circuits 155 to 158 are respectively loaded into the first to fourth registers 150 to 153, and simultaneously the contents of the fifth register 154 is loaded into the fifth latch circuit 159. The data element in the fifth latch circuit 159 is read and stored in the memory 160 at a fifth address. The fifth address is then incremented. The full operation of the coprocessor can be obtained from the references cited above, by simply replacing the shift registers 2 to 5 with the registers 150 to 154. As explained in these references, only one, two, or three of the first to fourth registers may be operated simultaneously for a particular computation.

In general, the computation devices permit clock frequencies far greater than the maximum frequency of the memory. One advantage of the storage device 140 of FIG. 2 is that it masks the access time of the memory with respect to the computation elements. Indeed, the only important thing is to carry out the data transfer between the first to fifth latch circuits 155 to 159 and the first to fifth registers 150 to 154 when the last bit is loaded into the fifth register 154 (i.e., just before there is a need for the first bits of the first to fourth registers 150 to 153). The read and write operations in the memory 160 may be distributed in time in a way that varies depending on k.

For example, if k=16 and if external data transfers by the storage device 140 are prohibited during operation, then the maximum frequency of the coprocessor is limited to four times the maximum frequency of the memory. Further, the present invention allows the exchange of data between a central memory and the storage device 140 during the computation. For example, it is possible to permit one to three external ports during one complete cycle. Thus, for k=16, a frequency between two and two and a half times the maximum frequency of the memory 160 can be used for the computation elements.

Besides the use of the storage device, there are several other changes in the coprocessor of FIG. 2 (with respect to the conventional coprocessor of FIG. 1). For example, the multiplexer 16 of FIG. 1 is replaced by a multiplexer 116 which has only two inputs (instead of five). The storage device 140 makes it possible to use the first register 150 as an external input (through the memory 160), and thus terminal Din can be eliminated. Additionally, it is possible to load zeros into the first register 150 (or to reset the register 150 to zero if it is designed with such a feature), and thus the input receiving a logic zero for the first register can be eliminated.

Similarly, the connection between the output of the multiplexer 150 and the multiplexer 16 becomes unnecessary because it was used to allow the data element in register 3 to be routed to register 17. To obtain the same effect with the storage device 140, it is enough to assign to the first register 140 an address pointer corresponding to the address pointer of the second register. Further, the multiplexer 15 is replaced by a multiplexer 115 having two inputs instead of four because the logic zeros and ones may be given by the second register 151.

A very useful aspect of the present invention for this type of coprocessor is the exchange of data between the registers. In the diagram of FIG. 1, the multiplexer 37 serves to allow for data to be exchanged between registers 2 to 5. With the storage device of the present invention, the exchange of data becomes virtual. Indeed, it is enough to change the address pointers that correspond to the different registers 150 to 153 to exchange data. The change of a pointer may be done as soon as the last data elements of a computation have been given. Thus, it is possible to successively string two computations even if the result of the previous computation is needed. The gain obtained in terms of processing time is considerable because it is possible to save a number of clock cycles equal to the number of bits of the data elements to be exchanged.

In terms of surface area, the storage device 140 is considerably smaller than the four registers that are used in the conventional coprocessor. For example, if the four registers 2 to 5 have a size of 1024 bits, they necessitate the use of about 65,000 transistors. An equivalent storage device may be constituted by five latch circuits and five registers such as 16-bit devices and a 4-kbit memory (for example, of the DRAM type), and this requires fewer than 10,000 transistors. This results in a gain in surface area of about 85%. If a faster SRAM is to be used, the same storage device uses fewer than 30,000 transistors, and this corresponds to a gain in surface area of more than 50%.

Figure 3:
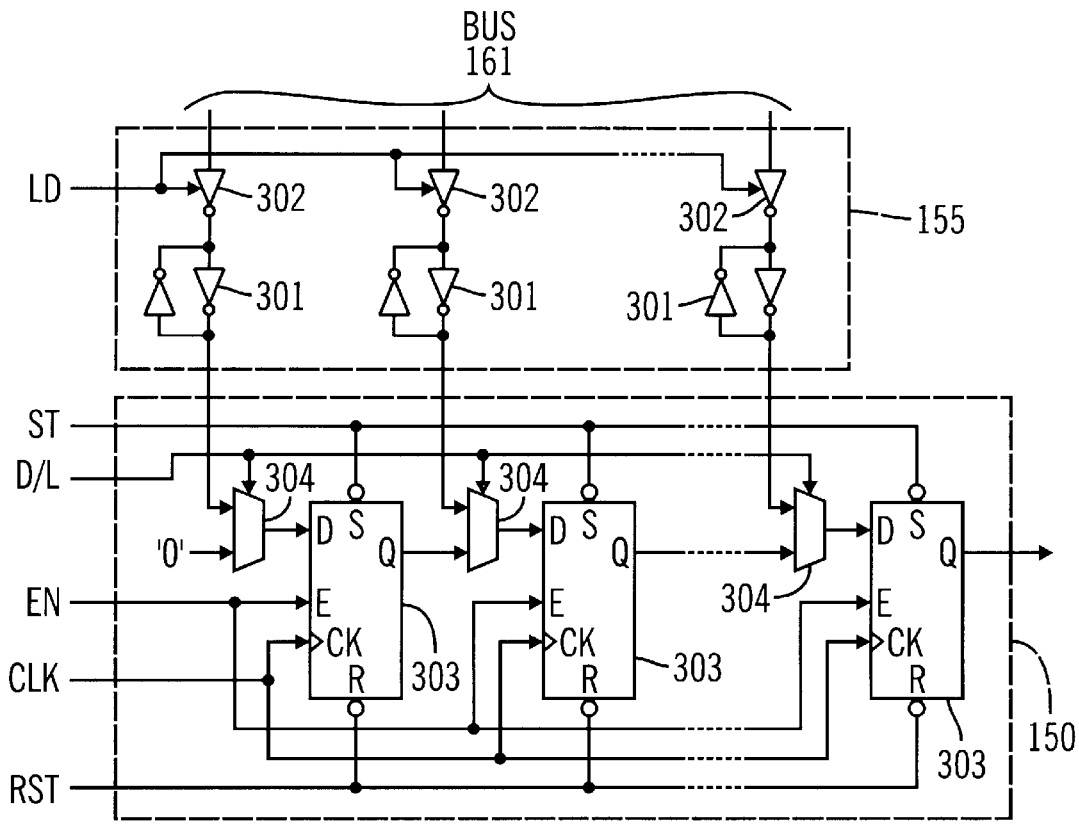
FIGS. 3 and 4 show shift registers according to exemplary embodiments of the present invention.

The first to fourth registers 150 to 153 have a similar structure. The first to fourth latch circuits 155 to 158 also have a similar structure. FIG. 3 shows an exemplary embodiment of register 150 and latch circuit 155. This embodiment is not meant to be limiting, but is given in order to show the functions required of these elements. The latch circuit 155 has k latches 301 and k inverters 302 with tristate outputs. Each latch 301 is formed by a pair of inverters mounted back to front in parallel, and each inverter 302 has a data input, an enabling input, and an output. The output of each of the inverters 302 is connected to one end of a corresponding one of the latches 301. The output enabling inputs of the inverters 302 are connected together and form a loading input that receives a loading signal LD. The data inputs of the inverters 302 are connected to the bus 161.

The register 150 has first to $k^{th}$ D-type latch circuits 303 and first to $k^{th}$ multiplexers 304. Each of the latch circuits 303 has a data input, an enabling input, a clock input, a resetting input, a setting input, and an output. The enabling inputs of the latch circuits 303 are connected together and receive a shift enabling signal EN. The clock inputs of the latch circuits 303 are connected together and receive a clock signal CLK. The resetting inputs are connected together and receive a resetting signal RST. The setting inputs of the latch circuits 303 are connected together and receive a setting signal SET. Each of the multiplexers 304 has first and second data inputs, a selection input, and an output. The selection inputs of all of the multiplexers 304 are connected together and receive a selection signal D/L.

When in a first state, the selection signal D/L sets up a connection between the first input and the output of each multiplexer 304, and when in a second state, sets up a connection between the second input and the output of each multiplexer 304. The first input of the first multiplexer 304 receives a logic zero. The first inputs of the second to $k^{th}$ multiplexers 304 are respectively connected to the outputs of the first to $(k-1)^{th}$ latch circuits 303. The second inputs of the k multiplexers 304 are respectively connected to the k latches 301. When the latch circuit 155 and the register 150 of FIG. 3 are incorporated into the storage device of FIG. 2, only the clock signal CLK and the selection signal D/L are common to the first to fourth registers 150 to 153. The other signals are driven individually.

When it is desired to load a word into the latch circuit 155, the memory 160 is read and then the loading signal LD is activated. When it is sought to transfer the data element in the latch circuit 155 into the register 150, the selection signal D/L is put into the second state, the shift enabling signal EN is activated. Then, as soon as an active edge of the clock occurs, the data element in the latch circuit 155 gets stored in the register 150. To shift the contents of the register 150, it is enough to put the signal D/L in the first state and validate the shift enabling signal EN. Then, during each active edge of the clock signal CLK, the data in the register 150 is shifted right by one bit.

The resetting signal RST and setting signal SET are used to put the register 150 into a predetermined state. When the contents of the register 150 are shifted right, zeros are loaded from the left. At the end of k shifts, the register 150 therefore contains k zeros. In certain cases, it may not be necessary to have the resetting signal since the register 150 can reset itself through the propagation of zeros. In FIG. 1, only multiplexers 14 and 15 are designed to supply logic ones. Therefore, the size of the registers can be reduced by only providing registers 151 and 153 with a setting operation. Furthermore, it is possible to perform a setting operation only on the latch circuit 303 whose output corresponds to the output of register 150.

It is also possible to replace the latch circuit and register of FIG. 3 with other equivalent devices. In other words, any devices that lead to the same result by performing a similar function can be used. For example, the multiplexers 304 may be eliminated by using latch circuits that have multiple inputs and selection means. Similarly, given the specific nature of the circuit formed by the latch circuit and the register, it is possible for one of ordinary skill in the art to achieve the same results through a specific and more compact architecture.

Figure 4:
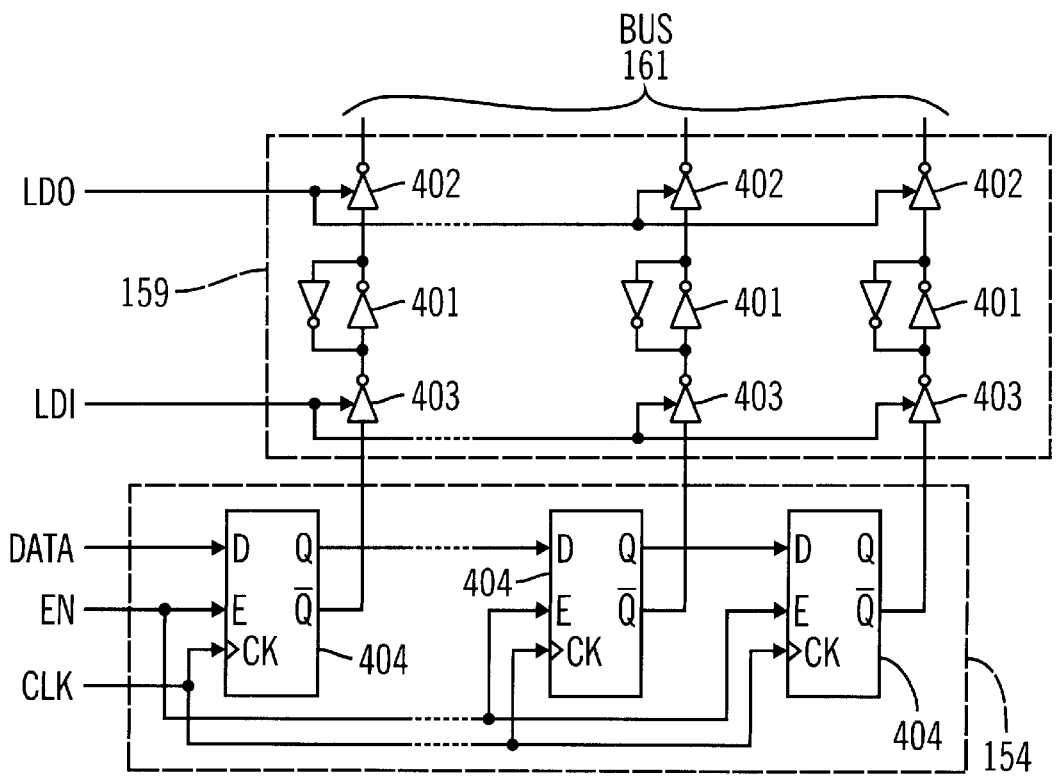

FIG. 4 shows an exemplary embodiment of the fifth latch circuit 159 and the fifth register 154. This embodiment is not meant to be limiting, but is given in order to show the functions required of these elements. The latch circuit 159 has k latches 401 and k first three-state output inverters 402 and k second three-state output inverters 403. Each latch 401 is formed by a pair of inverters mounted back to front in parallel, and each first inverter 402 and each second inverter 403 has a data input, an enabling input, and an output.

The data input of each of the first inverters 402 is connected to one end of a corresponding latch 401. The output enabling inputs of the first inverters 402 are connected together and form an unload enabling input that receives the unload signal LDO. The output of each of the second inverters 403 is connected to the other end of the corresponding latch 401. The output enabling inputs of the second inverters 402 are connected together and form a load enabling input that receives the load enabling signal LDI. The outputs of the first inverters 402 are connected to the bus 161.

The register 154 has first to $k^{th}$ D-type latch circuits 404, with each of the latch circuits 404 including a data input, an enabling input, a clock input, a non-inverter output, and an inverter output. The enabling inputs of the latch circuits 404 are connected together and receive a shift enabling signal EN. The clock inputs of the latch circuits 404 are connected together and receive a clock signal CLK. The data input of the first latch circuit 404 forms the series input of the register 154. The non-inverter outputs of the first to $(k-1)^{th}$ latch circuits 404 are respectively connected to the data inputs of the second to $k^{th}$ latch circuits 404. The inverter outputs of the first to $k^{th}$ latch circuits 404 are connected to the data inputs of the corresponding second inverter 403.

To load data elements into the register 154, the shift validation signal EN of the register is activated. Thus, at each leading edge of the clock signal CLK, the bits in the register 154 are shifted right by one unit, with the first latch circuit 404 receiving one bit of the result. Once a word is loaded into the register 154, the loading signal LDI is activated to load the word in the register 154 into the latch circuit 159. The storage of the word in the latch circuit 159 is performed by activating the unloading signal LDO and carrying out a write operation in the memory 160.

It is also possible to replace the latch circuit and register of FIG. 4 with other equivalent devices. Given the specific nature of the circuit formed by the latch circuit and the register, it is possible for one of ordinary skill in the art to achieve the same results through a specific and more compact architecture.

Figure 5:
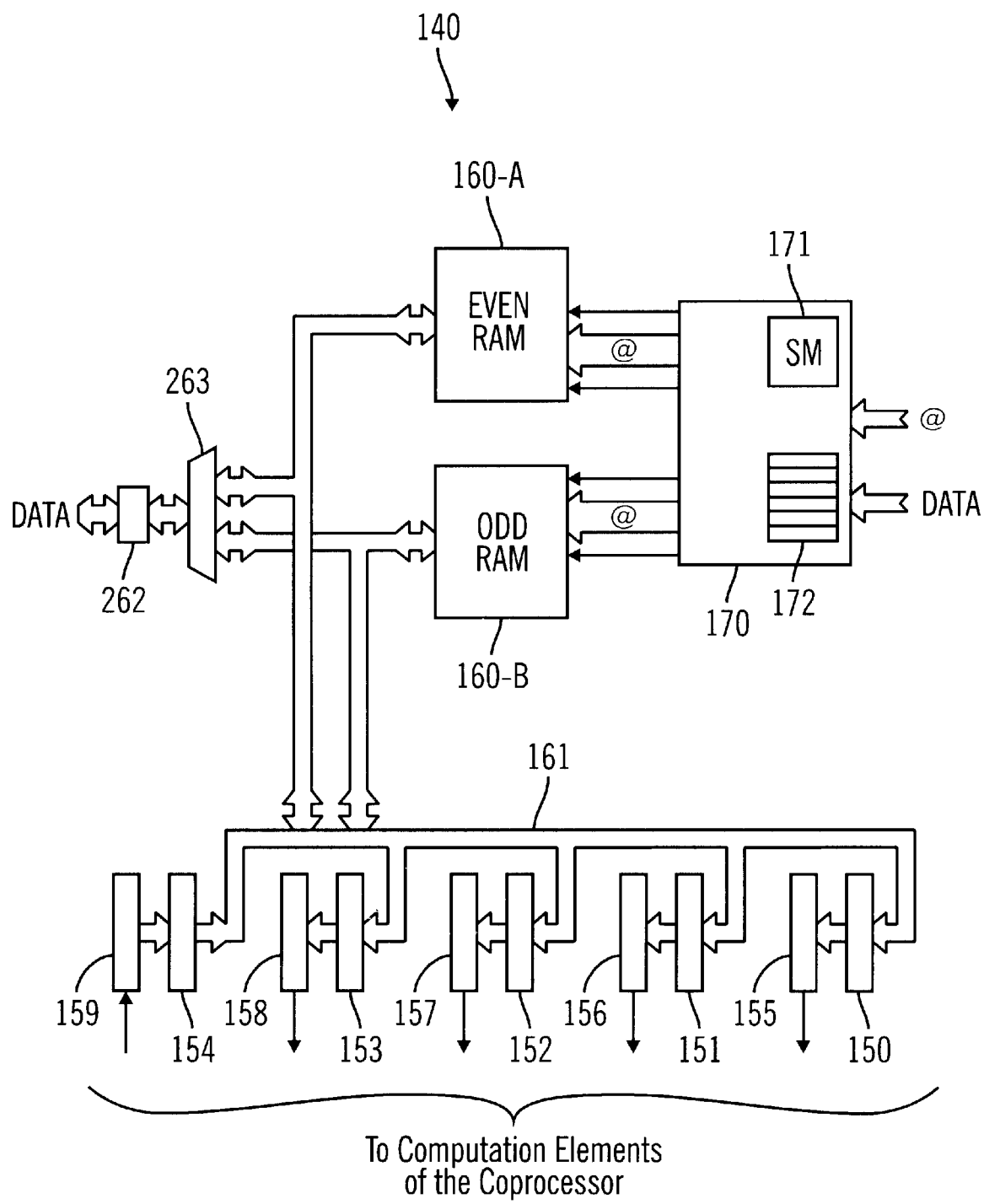
FIG. 5 shows a storage device according to another embodiment of the present invention.

FIG. 5 shows a storage device according to another embodiment of the present invention. In FIG. 5, elements corresponding to identical elements in FIG. 2 having the same reference numerals. The storage device 140 of FIG. 5 differs essentially by a subdivision of the memory 160 into first and second memories 160-A and 160-B, and in the addition of a control circuit 170 for managing the memories 160-A and 160-B. Each of the first and second memories 160-A and 160-B has a data bus, an address bus, and standard control inputs (e.g., for enabling the memory, read/write inputs, and the like).

The data bus of each of the memories 160-A and 160-B is organized into k'-bit words, with 2×k'=k. Thus, the data bus of the first memory is connected to the least significant lines of the bus 161, and the data bus of the second memory is connected to the most significant lines of the bus 161. Such a system provides the possibility of addressing the first and second memories 160-A and 160-B as even and odd memories from a communication port 262 using a multiplexer-demultiplexer 263. This kind of device is advantageous essentially because the coprocessor that includes the storage device 140 is often used on chip cards that use small processors (for example, 8 bit or 16 bit processors) while it is sought to have larger bit access (for example, 16 or 32 bits) on the bus 161.

The control circuit 170 relieves the external processor from the task of managing the storage device. The control circuit 170 includes a state machine 171 and a bank of registers 172. The bank of registers 172 has as many address registers as there are shift registers 150 to 154. Each address register contains an address pointer associated with one of the shift registers 150 to 154. The bank of registers 172 also includes one or more additional address registers to store one or more addresses from an external processor that seeks to read and/or write data elements in the memories 160-A and 160-B.

All of the address registers are provided with incrementation circuitry that increment the contents of the register after each use. The register bank 172 preferably also includes an instruction register to make different configurations of the state machine 171 possible and a state register to provide information on the external processor. The state machine 171 is used to control the memories 160-A and 160-B, the shift registers 150 to 154, and the latch circuits 155 to 159. In some embodiments, different cycles of states are provided as a function of the control register.

Figure 6:
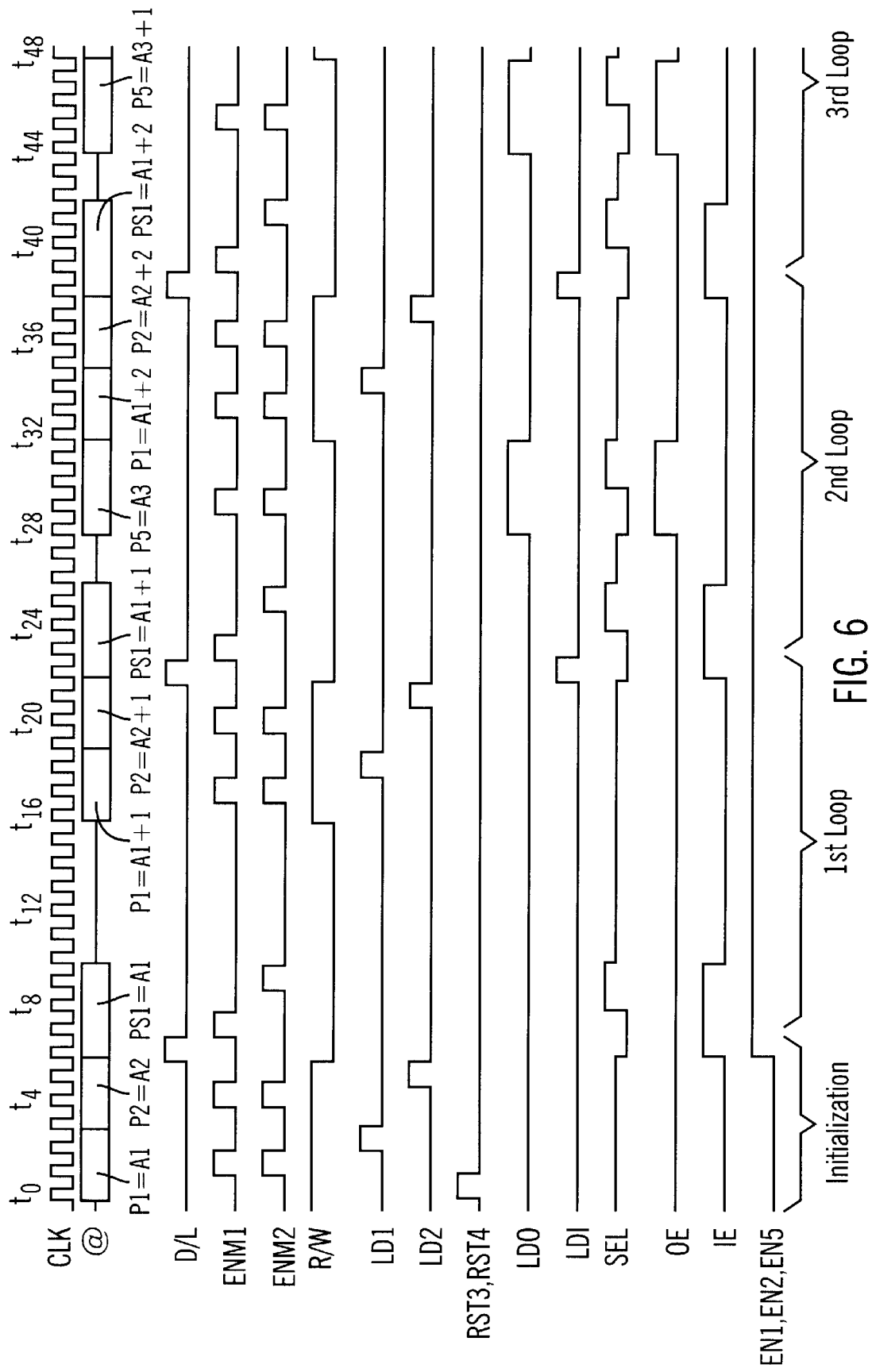
FIG. 6 shows a timing diagram illustrating an exemplary operation of the storage device of FIG. 5.

FIG. 6 shows a timing diagram illustrating an exemplary operation of the state machine of FIG. 5. This exemplary operation is for a cycle of states that corresponds to an operation in the coprocessor for which only the first, second, and fifth registers 150, 151, and 154 are used by the coprocessor. The data elements corresponding to the first and second registers 150 and 151 are stored starting from the first and second addresses A1 and A2, respectively. The data element corresponding to the result is stored starting from a third address A3. Furthermore, it is sought to replace the data element located beginning at the first address A1 as it is used, and to read the result at the third address A3. It is assumed that the data elements of the first and second registers are already stored in the memories 160-A and 160-B.

FIG. 6 shows only signals whose states change during the state cycle corresponding to the example described above. The signal CLK corresponds to the clock signal used by the computation elements of the coprocessor and by the registers 150 to 154. The address signal @ corresponds to addresses sent simultaneously to the memories 160-A and 160-B. The signals ENM1 and ENM2 correspond to the enabling signals of the first and second memories 160-A and 160-B, respectively. The signal R/W is used to set the two memories for a read operation (level 1) or a write operation (level 0), with the enabling signals ENM1 or ENM2 enabling the read or write operation in the appropriate memory. The signal D/L indicates whether the first to fourth registers 150 to 153 operate in a data shift mode or a data loading mode using the first to fourth latch circuits 155 to 158.

The signals LD1 to LD4 are the loading signals of the first to fourth latch circuits 155 to 158, respectively. (The signals LD3 and LD4 are not shown because they are always at zero in this example.) The signals RST1 to RST4 correspond to the resetting signals of the first to fourth registers 150 to 153, respectively. (The signals RST1 and RST2 are not shown because they are always at zero in this example). The signal LDO is the unloading signal of the fifth latch circuit 159. The signal LDI is the loading signal of the fifth latch circuit 159. The signal SEL is the selection signal of the multiplexer/demultiplexer 263, with the communication port 262 being coupled with the first memory 160-A when signal SEL is at "0", and with the second memory 160-B when signal SEL is at "1".

The signal OE enables the data output for the communication port 262. The signal IE enables the data input for the port 262. The signals EN1 to EN5 correspond to the shift enabling signals of the first to fifth registers 150 to 154, respectively. (The signals EN3 and EN4 are not shown because they are constantly at "0" in this example). The signals SET1 to SET4 are used to set the first to fourth registers 150 to 153, but are not shown because they are constantly at "0" in this example. Furthermore, intermediate levels have been shown in the address signal @ and on the signal SEL. These intermediate levels indicate that the level of the signal is not taken into account and can be of any value.

The clock signal CLK is also used to synchronize the state machine that produces the different signals. Thus, the signals are shown synchronized on the leading edges of the clock signal CLK. The signals resulting from the signal CLK are necessarily slightly offset with respect to this signal, so as to allow efficient operation of the synchronized element. With each leading edge of the clock signal CLK, there is associated an instant $t_i$. The timing diagrams begin at instant $t_0$ and normally finish at the end of the operation by the coprocessor (for example, for the 512 bit data elements, at instant $t_{550}$). However, for practical reasons, the timing diagrams of FIG. 6 stop at instant $t_{48}$ and the instants are labeled in sets of four.

At instant $t_0$, the storage device is reset. A pulse is sent on the signals RST3 and RST4 to reset the third and fourth registers 152 and 153. Simultaneously, the address pointer P1 in the address register corresponding to the first register 150 is placed on the address bus of the two memories 160-A and 160-B. The signal R/W is set in order to indicate that the memories are working in read mode. All of the other signals are reset. At instant $t_1$, the signals RST3 and RST4 are reset for the remainder of the cycle. A simultaneous reading operation is initiated in the two memories by setting the signals ENM1 and ENM2.

At instant $t_2$, the signal LD1 is activated so as to load the data elements that were read from the memories 160-A and 160-B into the first latch circuit 155. The signals ENM1 and ENM2 are deactivated. The signal LD1 could have been activated earlier if the memories allow a read operation to be performed in less than one cycle of the clock signal. Similarly, the signals ENM1 and ENM2 may be deactivated later. Additionally, the forms of these signals depends on the technological choices made in implementing the memory and the latch circuit, which may dictate different signal shapes.

At instant $t_3$, the first k-bit word of the data elements, which is stored starting from the first address A1, is loaded into the first latch circuit 155. The signal LD1 is deactivated and the address provided to the memories 160-A and 160-B is changed. From instant $t_3$ to instant $t_6$, the first word of the data element located beginning at the second address A2 is loaded into the second latch circuit 156. This loading into the second latch circuit 156 is done in the manner indicated above, by simply replacing the signal LD1 with the signal LD2.

At instant $t_6$, the signal D/L is activated so as to prompt a leading edge synchronous loading of the first and second registers 150 and 151. The enabling signals EN1, EN2, and EN5 are activated so that the computation cycle begins at the next iteration. At the same time, the word located at the first address A1 starts getting changed by providing the first address A1 to the memories 160-A and 160-B, with the signal R/W being at a level which indicates that a write operation will be performed and a word of k' least significant bits being presented at the communication port 262. The signal SEL is positioned at a low level in order to select the data bus of the first memory 160-A and the signal IE is activated in order to receive an external data element.

From instant to $t_0$ instant $t_7$, an initialization step takes place. At instant $t_7$, the computation in the processor, and therefore the first operation loop of the storage device, takes place. During this first loop, a k-bit word is loaded into the address A1. The signal ENM1 is activated to write the k-bit word at the communication port 262 in the first memory 160-A. At instant $t_8$, the signal ENM1 is deactivated. At the same time, the signal SEL is positioned at a high level in order to select the data bus of the second memory 160-B and present a most significant k'-bit word at the communication port 262. At instant $t_9$, the signal ENM2 is activated to write the k'-bit word at the communication port 262 in the second memory 160-B. At instant $t_{10}$, the signal ENM2 and the signal 13 are deactivated.

From instant $t_{16}$ to instant $t_{26}$, a synchronization of the signals D/L, ENM1, ENM2, R/W, LD1, LD2, SEL, and IE is performed. This synchronization is identical to the synchronization that has taken place between the instants $t_0$ and $t_{10}$. However, the address pointers are incremented by one unit. Between instants $t_{22}$ and $t_{23}$, the signal LDI is activated in order to load the contents of the fifth register 154 into the fifth latch circuit 159 at instant $t_{23}$, which marks the end of the first loop and the beginning of the second loop.

The second loop has an additional phase as compared with the first loop. The additional phase consists in writing a first word of the result data element at the address A3 and outputting the word from the storage device. This phase runs between instants $t_{28}$ and $t_{32}$. The third address A3 is given to the memories 160-A and 160-B while the signal R/W indicates that a write operation will be performed. At the same time, the signal LDO is activated to have the word in the fifth latch circuit 159 placed on the bus 161, and the signal OE is activated to bring out a data element at the communication port 262.

The word is written simultaneously in the two memories 160-A and 160-B by the activation of the signals ENM1 and ENM2 between instants $t_{29}$ and $t_{30}$. The outputting of the word is performed in two stages by positioning the signal SEL in the low state to select the first memory 160-A between instants $t_{28}$ and $t_{30}$ and in the high state to select the second memory 160-B between instants $t_{30}$ and $t_{32}$. The second loop ends at instant $t_{39}$. The following loops are identical to the second loop, with the address pointers incremented at each loop. The loops succeed each other identically so long as the data elements to be given have to be output from the storage device. Smaller loops (without operations of loading into the first and second registers 150 and 151) terminate the computation to make it possible to store the entire result, which is generally lagged by the time needed to carry out the computation.

Accordingly, with this device of the present invention, only seven clock periods are needed to initialize the computation. Furthermore, a data element is changed in the memory during the computation. This makes it possible to string two computations with only one reduced number of periods of the clock signal during the transition (smaller than k in general, with k being equal to 16 or 32). For example, a stringing of this type with the 512-bit registers of the conventional coprocessor requires at least 512 periods of the clock signal to change a data element to obtain a new computation.

While the embodiments of the present invention that are described above utilize specific circuit elements and control signals, many variants are possible (e.g., as a function of the type of memory being used). Thus, the values of the signals may change as a function of the different constraints dictated by the specific memory. Similarly, the timing diagrams may be highly modified as a function of the signals needed to control the memory (or memories) and as a function of the access times of the memory and the period of the clock signal.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A storage device comprising:
   at least one memory having a parallel data bus and a parallel address bus;
   a first k-bit latch circuit having a parallel input and a parallel output, the parallel input being connected to the data bus;
   a first k-bit shift register having a parallel input and a series output, the parallel input being connected to the output of the first latch circuit;
   a second k-bit latch circuit having a parallel input and a parallel output, the parallel output being connected to the data bus; and
   a second k-bit shift register having a series input and a parallel output, the parallel output being connected to the input of the second latch circuit.

2. The storage device as defined in claim 1, further comprising:
   a third k-bit latch circuit having a parallel input and a parallel output, the parallel input being connected to the data bus; and
   a third k-bit shift register having a parallel input and a series output, the parallel input being connected to the output of the third latch circuit.

3. The storage device as defined in claim 2, further comprising:
   a fourth k-bit latch circuit having a parallel input and a parallel output, the parallel input being connected to the data bus; and
   a fourth k-bit shift register having a parallel input and a series output, the parallel input being connected to the output of the fourth latch circuit.

4. The storage device as defined in claim 3, further comprising:
   a fifth latch circuit having a parallel input and a parallel output, the parallel input being connected to the data bus; and
   a fifth shift register having a parallel input and a series output, the parallel input being connected to the output of the fifth latch circuit.

5. The storage device as defined in claim 4, further comprising a control circuit coupled to the address bus, the control circuit including a plurality of address registers for storing as many address pointers as the number of k-bit shift registers.

6. The storage device as defined in claim 1, further comprising a control circuit coupled to the address bus, the control circuit including a plurality of address registers for storing as many address pointers as the number of k-bit shift registers.

7. The storage device as defined in claim 1, further comprising a k-bit parallel port connected to the data bus for external communications.

8. The storage device as defined in claim 1, wherein the memory consists of two independent memories that each have k'-bit data access, where k=2×k', and one of the independent memories is coupled to the least significant lines of the data bus and the other independent memory is coupled to the most significant lines of the data bus.

9. The storage device as defined in claim 8, further comprising a k'-bit parallel port selectively coupled to either the most significant lines or the least significant lines of the of the data bus.

10. The storage device as defined in claim 9, wherein the first shift register includes at least one of resetting circuitry for resetting all of the bits of the register and setting circuitry for setting all of the bits of the register.

11. The storage device as defined in claim 1, wherein the first shift register includes at least one of resetting circuitry for resetting all of the bits of the register and setting circuitry for setting all of the bits of the register.

12. A coprocessor of the type that includes a series input terminal, a series output terminal, and computation elements located on at least one data path between the series input terminal and the series output terminal such that if a data element is serially shifted to the series input, then a result is recovered in series at the series output after having passed through at least some of the computation elements, said coprocessor comprising:
   at least one memory having a parallel data bus and a parallel address bus;
   a first k-bit latch circuit having a parallel input and a parallel output, the parallel input being connected to the data bus;
   a first k-bit shift register having a parallel input and a series output, the parallel input being connected to the output of the first latch circuit;
   a second k-bit latch circuit having a parallel input and a parallel output, the parallel output being connected to the data bus; and
   a second k-bit shift register having a series input and a parallel output, the parallel output being connected to the input of the second latch circuit,
   wherein the series input terminal is coupled to the output of the first shift register, and
   the output terminal is coupled to the input of the second shift register.

13. The coprocessor as defined in claim 12, further comprising:
   a third k-bit latch circuit having a parallel input and a parallel output, the parallel input being connected to the data bus; and
   a third k-bit shift register having a parallel input and a series output, the parallel input being connected to the output of the third latch circuit.

14. The coprocessor as defined in claim 13, further comprising:
   a fourth k-bit latch circuit having a parallel input and a parallel output, the parallel input being connected to the data bus; and
   a fourth k-bit shift register having a parallel input and a series output, the parallel input being connected to the output of the fourth latch circuit.

15. The coprocessor as defined in claim 14, further comprising:
   a fifth latch circuit having a parallel input and a parallel output, the parallel input being connected to the data bus; and
   a fifth shift register having a parallel input and a series output, the parallel input being connected to the output of the fifth latch circuit.

16. The coprocessor as defined in claim 15, further comprising a control circuit coupled to the address bus, the control circuit including a plurality of address registers for storing as many address pointers as the number of k-bit shift registers.

17. The coprocessor as defined in claim 12, further comprising a k-bit parallel port connected to the data bus for external communications.

18. The coprocessor as defined in claim 12,
  wherein the memory consists of two independent memories that each have k'-bit data access, where k=2×k', and
  one of the independent memories is coupled to the least significant lines of the data bus and the other independent memory is coupled to the most significant lines of the data bus.

19. The coprocessor as defined in claim 18, further comprising a k'-bit parallel port selectively coupled to either the most significant lines or the least significant lines of the of the data bus.

20. An IC chip card including a microprocessor, storage, and a coprocessor, said coprocessor comprising:
  a series input terminal;
  a series output terminal;
  computation elements located on at least one data path between the series input terminal and the series output terminal;
  at least one memory having a parallel data bus and a parallel address bus;
  a first k-bit latch circuit having a parallel input and a parallel output, the parallel input being connected to the data bus;
  a first k-bit shift register having a parallel input and a series output, the parallel input being connected to the output of the first latch circuit;
  a second k-bit latch circuit having a parallel input and a parallel output, the parallel output being connected to the data bus; and
  a second k-bit shift register having a series input and a parallel output, the parallel output being connected to the input of the second latch circuit,
  wherein the series input terminal is coupled to the output of the first shift register, and
  the output terminal is coupled to the input of the second shift register.

21. The IC chip card as defined in claim 20, wherein the coprocessor further comprises:
  a third k-bit latch circuit having a parallel input and a parallel output, the parallel input being connected to the data bus;
  a third k-bit shift register having a parallel input and a series output, the parallel input being connected to the output of the third latch circuit;
  a fourth k-bit latch circuit having a parallel input and a parallel output, the parallel input being connected to the data bus; and
  a fourth k-bit shift register having a parallel input and a series output, the parallel input being connected to the output of the fourth latch circuit.

22. The IC chip card as defined in claim 21, wherein the coprocessor further comprises a control circuit coupled to the address bus, the control circuit including a plurality of address registers for storing as many address pointers as the number of k-bit shift registers.

23. The IC chip card as defined in claim 20,
  wherein the memory consists of two independent memories that each have k'-bit data access, where k=2×k', and
  one of the independent memories is coupled to the least significant lines of the data bus and the other independent memory is coupled to the most significant lines of the data bus.

24. The IC chip card as defined in claim 23, further comprising a k'-bit parallel port selectively coupled to either the most significant lines or the least significant lines of the of the data bus.

* * * * *